(12) United States Patent
Takeda et al.

(10) Patent No.: US 9,097,088 B2
(45) Date of Patent: Aug. 4, 2015

(54) DOWNHOLE TOOL THERMAL DEVICE

(75) Inventors: Jiro Takeda, Machida (JP); Lahcen Garando, Orsay (FR); Jose Gregorio Labanda, Willemstad (CW)

(73) Assignee: Schlumberger Technology Corporation, Sugar Land, TX (US)

( * ) Notice: Subject to any disclaimer, the term of this patent is extended or adjusted under 35 U.S.C. 154(b) by 608 days.

(21) Appl. No.: 13/316,588

(22) Filed: Dec. 12, 2011

(65) Prior Publication Data

US 2012/0152545 A1 Jun. 21, 2012

Related U.S. Application Data

(60) Provisional application No. 61/423,584, filed on Dec. 15, 2010.

(51) Int. Cl.
 *E21B 36/00* (2006.01)
 *E21B 47/01* (2012.01)
 *H01L 23/36* (2006.01)

(52) U.S. Cl.
 CPC ............ *E21B 36/001* (2013.01); *E21B 47/011* (2013.01); *H01L 23/36* (2013.01); *H01L 2224/16225* (2013.01); *H01L 2224/32225* (2013.01); *H01L 2224/73204* (2013.01); *H01L 2924/1461* (2013.01)

(58) Field of Classification Search
 CPC ..... E21B 36/00; E21B 36/001; E21B 47/011; F28F 13/18; F28F 13/00; H01L 23/34; H01L 2224/16225; H01L 2224/32225; H01L 2224/73204; H01L 2924/00; H01L 2924/1461
 USPC ............ 166/302, 57; 257/706, 712, 713, 717, 257/720
 See application file for complete search history.

(56) References Cited

U.S. PATENT DOCUMENTS

| | | | |
|---|---|---|---|
| 6,134,892 A | 10/2000 | Turner et al. | |
| 6,831,358 B2 * | 12/2004 | Tsai | ............................. 257/717 |
| 2006/0117759 A1 | 6/2006 | Hall et al. | |
| 2008/0178920 A1 | 7/2008 | Ullo | |
| 2012/0018167 A1 * | 1/2012 | Konopczynski et al. | ...... 166/369 |
| 2013/0092379 A1 * | 4/2013 | Singh | ............................ 166/302 |

OTHER PUBLICATIONS

International Search Report for the equivalent PCT patent application No. PCT/IB2011/003006 issued on Apr. 27, 2012.

\* cited by examiner

*Primary Examiner* — Yong-Suk (Philip) Ro
(74) *Attorney, Agent, or Firm* — Daryl R. Wright; Jody DeStefanis

(57) ABSTRACT

Subterranean devices are provided that are configured or designed for high temperature downhole use. The downhole devices comprise an electronic device configured or designed for downhole use in the well and a heat dissipation system. The heat dissipation may include one or more active coolers and a micro-particulate radiation improving coating applied to the active cooler.

14 Claims, 11 Drawing Sheets

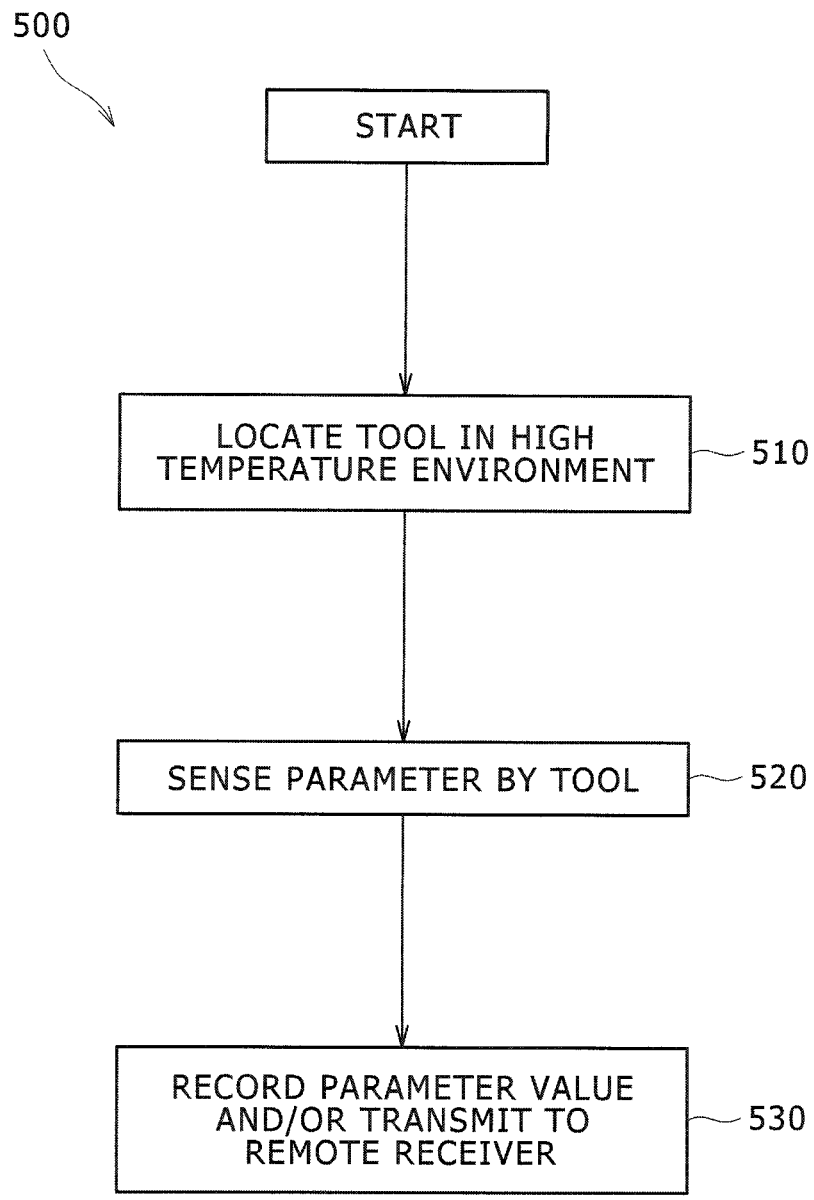

DOWNHOLE TOOL THERMAL DEVICE

RELATED APPLICATIONS

This application claims the benefit of U.S. Provisional Application No. 61/423,584, filed Dec. 15, 2010, the contents of which are herein incorporated for all intents and purposes by reference.

BACKGROUND

Description of Related Art

The following descriptions and examples are not admitted to be prior art by virtue of their inclusion in this section.

Logging and monitoring boreholes have been done for many years to enhance and quantify recovery of oil and gas deposits. Data relating to earth formations are acquired by logging operations for purposes of exploration, development and management of hydrocarbon or water reservoirs, and sequestration of substances such as $CO_2$, among others. Such operations, including wireline logging, measurement-while-drilling (MWD) and logging-while-drilling (LWD), typically use a downhole tool having various sensing components for a range of functions such as collecting, storing, processing, and transmitting data.

In the logging of boreholes, one method of making measurements underground includes attaching one or more tools to a wireline that is in turn connected to a surface system. The tools are then lowered into a borehole by the wireline and drawn back to the surface ("logged") through the borehole while taking measurements. In some cases, the wireline is an electrical conducting cable with limited data transmission capability. In addition to wireline applications, measurements are also taken in drilling and measuring (D&M), permanent monitoring, and completions, among other areas of common applicability. For example, permanent monitoring systems are established with permanent sensors that are also generally attached to an electrical cable. After drilling a well, various sensing components may be fixed to production tubing for purposes of analyzing hydrocarbons and other fluids present in the wellbore, and for controlling fluid flows in the wellbore. In this, various sensing components typically are used for purposes of production logging.

Long term reservoir monitoring and permanent monitoring are other applications that require deployment of sensors in completed wells. In these cases, sensor arrays may be deployed in a well by various means. After which, the sensor data may be gathered and transmitted uphole via a telemetry system for further processing and analysis.

Recent developments in drilling technology require that downhole tools be capable of effectively collecting large amounts of various forms and types of data with high sensitivity or selectivity. This data may then be transmitted, for example, through mud telemetry, while drilling in the oilfield or downhole environments.

In view of the foregoing, applicants have recognized that there is a need for improved downhole systems that are able to operate with high sensitivity or selectivity in high-temperature environments. Typical downhole systems have temperature sensitive electronic devices that can function efficiently to about 150 degrees Celsius. During operation, the electronic devices generate additional heat that often builds up in a downhole tool. The built up heat can be detrimental to the operation of the downhole tool.

Cooling devices may be employed to maintain the electronics within an optimal temperature range and, in some cases, to even extend the operating temperature range of the components. However, the utilization of traditional cooling devices in downhole tools is often constrained by space limitations and the lack of air circulation in the downhole tools. Downhole systems in the past have not been completely successful in improving the operating temperature range of downhole electronic devices and in extending the life of the electronic devices in high-temperature operating conditions.

The conventional downhole systems noted in the preceding are not intended to be exhaustive, but rather are among many that are required to operate at elevated temperatures for extended periods of time. The above should be sufficient, however, to demonstrate that downhole apparatus and systems existing in the past will admit to worthwhile improvement.

SUMMARY

In accordance with one embodiment of the present disclosure, a subterranean tool is configured to operate downhole in a well traversing a formation. In some aspects, the tool comprises at least one electronic device configured or designed for downhole use in combination with a heat dissipation system. The heat dissipation system may comprise at least one active cooler and micro-particulate radiation improving coating that is applied to the active cooler. In some cases, the electronic device may be configured or designed for sensing physical and/or chemical characteristics downhole, within a borehole.

In some exemplary embodiments, the electronic device may be configured or designed for use at downhole temperatures in excess of about 175 degrees Celsius, for example, at temperatures of about 200 degrees Celsius. The electronic device may be configured to perform a variety of downhole functions. For example, the electronic device may be configured to function as various optical devices for downhole applications. In some possible embodiments, the device may comprise an optical device configured to function as a downhole photo-sensitive detector. The subterranean tool may further comprise one or more optical communications modules coupled to, connected to, or interacting with the optical device. The subterranean tool may also comprise one or more downhole fluid analysis modules coupled to, connected to, or interacting with the optical device.

Another embodiment of a downhole sensing system according to the present disclosure may include a surface data acquisition unit, a downhole data acquisition unit, and a communications interface between the surface data acquisition unit and the downhole data acquisition unit. In addition, the downhole sensing system may further include a downhole tool and a downhole electrical tool bus operatively connected between the downhole data acquisition unit and the downhole tool. The downhole tool may include at least one sensing device configured or designed for downhole use to sense a local condition in a well in combination with a heat dissipation system. The heat dissipation system may include at least one active cooler and a micro-particulate radiation improving coating that is applied to at least a portion of the active cooler.

Additional advantages and novel features will be set forth in the description which follows or may be learned by those skilled in the art through reading these materials or practicing embodiments of the invention. The advantages of various embodiments of the invention may be achieved through the means recited in the attached claims.

BRIEF DESCRIPTION OF THE DRAWINGS

The accompanying drawings illustrate certain embodiments and are a part of the specification. Together with the following description, the drawings demonstrate and explain some of the principles of the present invention. The drawings are as follows:

FIG. 5 is a flowchart of one possible method in accordance with embodiments of the present disclosure.

Figure 1:
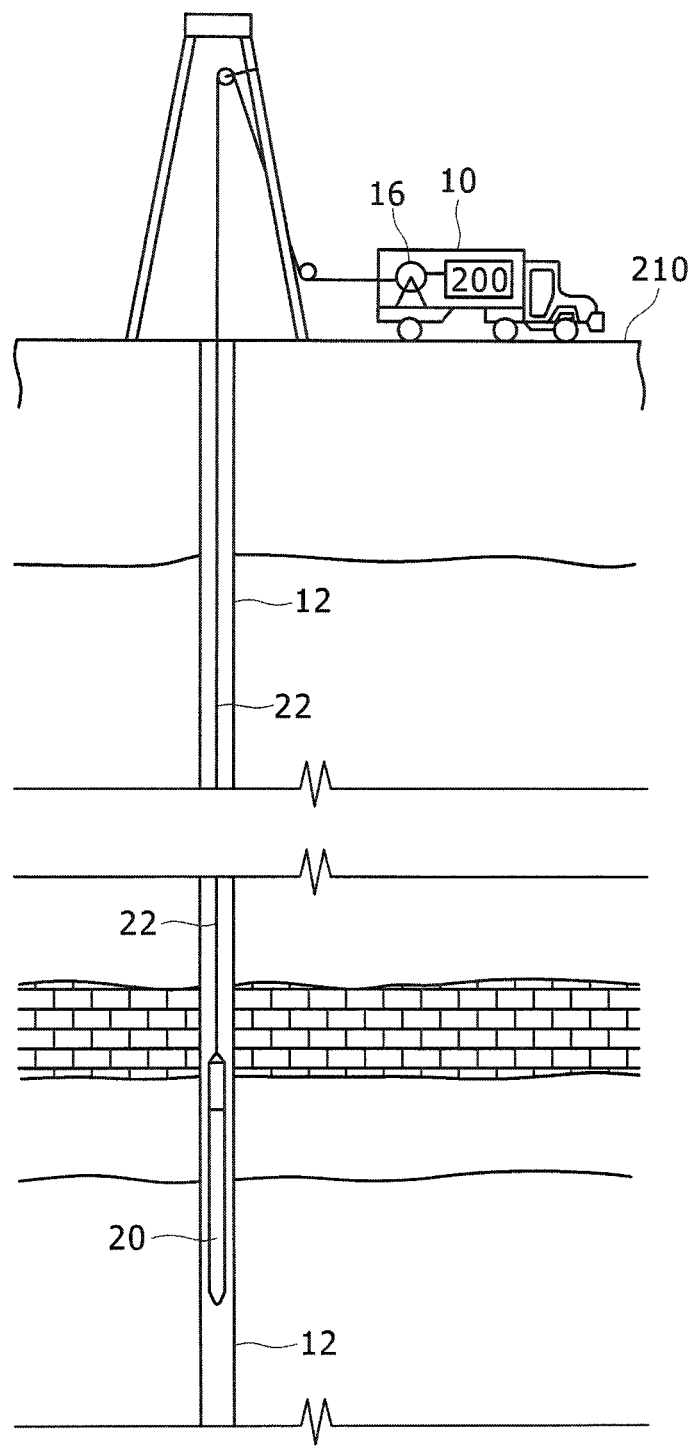
FIG. 1 shows an exemplary operational context for a downhole system in accordance with the disclosure herein.

Throughout the drawings, identical reference numbers and descriptions indicate similar, but not necessarily identical, elements. While the principles described herein are susceptible to various modifications and alternative forms, specific embodiments have been shown by way of example in the drawings and will be described in detail herein. However, it should be understood that embodiments of the disclosure are not intended to be limited to the particular forms disclosed. Rather, embodiments of the disclosure include all modifications, equivalents and alternatives falling within the scope of the appended claims.

DETAILED DESCRIPTION

Illustrative embodiments and aspects of the present disclosure are described below. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such development effort might be complex and time-consuming, but would nevertheless be a routine undertaking for those of ordinary skill in the art having the benefit of this disclosure.

Reference throughout the specification to "one embodiment," "an embodiment," "some embodiments," "one aspect," "an aspect," or "some aspects" means that a particular feature, structure, method, or characteristic described in connection with the embodiment or aspect is included in at least one embodiment of the present invention. Thus, the appearance of the phrases "in one embodiment" or "in an embodiment" or "in some embodiments" in various places throughout the specification are not necessarily all referring to the same embodiment. Furthermore, the particular features, structures, methods, or characteristics may be combined in any suitable manner in one or more embodiments. The words "including" and "having" shall have the same meaning as the word "comprising."

As used throughout the specification and claims, the term "downhole" refers to a subterranean environment, particularly in a wellbore. "Downhole tool" is used broadly to mean any tool used in a subterranean environment including, but not limited to, a logging tool, an imaging tool, an acoustic tool, a permanent monitoring tool, and a combination tool. "High temperature" refers to downhole temperatures in excess of approximately 115 degrees Celsius.

Moreover, inventive aspects lie in less than all features of a single disclosed embodiment. Thus, the claims following the Detailed Description are hereby expressly incorporated into this Detailed Description, with each claim standing on its own as a separate illustrative embodiment of this disclosure.

In consequence of the background discussed above, and other factors that are known in the field of oilfield exploration and development, management of oil and water reservoirs, and sequestration of substances such as $CO_2$, some embodiments of downhole systems are disclosed herein comprising devices that are suitable for operation in oilfield or subterranean environments. The devices use heat dissipation or cooling systems that improve the core efficiency of infrared radiation by the use of micro-particulate radiation improving coating and, in some embodiments, in combination with an active cooling system to provide tools and/or modules for downhole use.

The present applicants recognized that heat radiation improving micro-particulate coatings have characteristic properties that are surprisingly effective in downhole conditions where temperatures may be in excess of about 200 degrees Celsius. Such improvement in heat radiation may be significant and could be utilized for the purposes of improved, efficient long term deployment of systems in elevated temperature conditions.

It is possible to adapt and apply micro-particulate radiation improving coatings in combination with active cooling devices for purposes of downhole tools and systems. The use of coatings disclosed herein are capable of replacing conventional painted surfaces that might be utilized for purposes of eliminating heat effects. Additionally, the techniques proposed in the present disclosure, which in some cases are based on thermal radiation in the far infrared region, help reduce overall tool size and extend the operating temperature of heat sensitive critical components without the need for expensive heat shielding structures.

The present disclosure contemplates wide applicability of the heat dissipating techniques for various temperature sensitive electronic devices and sensors. Such devices include, but are not limited to, memory devices, photo image sensors, processors, power devices, converters, among other electronic devices that may be utilized in downhole tools or permanent applications of the type described herein. The micro-particulate coatings may be applied to a thermally reactive side, such as a hot side, i.e., where the heat has to be dissipated from the target device. In addition, the micro-particulate coatings may be applied to the interior of an enclosure or housing in which the target device is located.

Turning now to the drawings, wherein like numerals indicate like parts, the disclosure herein is directed to the concept of various techniques that may be utilized to facilitate and improve heat radiation in downhole tools and systems. The present disclosure contemplates various downhole tools and systems in addition to other transitory and permanent applications that utilize one or more electronic devices that are configured or designed for purposes of sensing data relating to environmental and tool parameters downhole, within a borehole.

In this, the tools and sensing systems disclosed herein may effectively sense and store characteristics, relating to components of downhole tools as well as formation parameters, at elevated temperatures and pressures. Chemicals and chemical properties of interest in oilfield exploration and development may also be measured and stored by the sensing systems contemplated by the present disclosure.

The sensing systems herein may be incorporated in tool systems such as wireline logging tools, measurement-while-drilling and logging-while-drilling tools, permanent monitoring systems, drill bits, drill collars, sondes, among others. For purposes of this disclosure, when any one of the terms wireline, cable line, slickline or coiled tubing or conveyance is used it is understood that any of the above-referenced deployment means, or any other suitable equivalent means, may be used with the present disclosure without departing from the spirit and scope of the disclosure.

The present applicants have found that some micro-particulate coatings with heat radiation behavior and desirable heat transport properties are suitable for heat-resistant and high-speed electronics devices. In this, the applicants surprisingly found that coating materials with micro-particles transfer heat away from a downhole tool substrate, resulting in improved efficiencies, performance and longevity of the coated electronic parts. The coating systems of the disclosure are used to reduce residual heat from electronic components, thereby improving the efficiency of the thermal devices such as downhole tool cooling systems. For example, micro-particulate coating material may be obtained from Ceramission Co., Ltd., Japan.

FIG. 1 is an exemplary embodiment of a system for downhole analysis and sampling of formation fluids utilizing a downhole tool according to the present disclosure. For the purpose of simplifying the detailed description, embodiments employing wireline downhole tools will be described, although applications of the disclosure may not be limited to this described area. A variety of applications may be apparent to a person of skill in the art both within oilfield related environments and external to this industry. As such, FIG. 1 depicts one possible setting for utilization of embodiments of this disclosure and other operating environments also are contemplated herein.

In FIG. 1, a service vehicle 10 is situated at the formation surface 210 of a wellsite having a borehole or wellbore 12 with a downhole tool 20 suspended in the borehole 12. The downhole tool 20 may be suspended from the lower end of a cable 22 spooled on a winch or cable drum 16 at the formation surface 210. The downhole tool 20 needs to withstand high temperatures as the borehole 12 may have high temperature conditions such as 115 degrees Celsius or above.

Typically, the borehole 12 contains a combination of fluids such as water, mud filtrate, formation fluids, and the like. In some cases, the downhole tool 20 may be used for testing earth formations and analyzing the composition of fluids from a formation. In other cases, the downhole tool 20 may be used to measure various parameters such as, for example, flow rates, temperatures, pressures, fluid properties, gamma radiation properties, and the like. Additionally, the downhole tool 20 may have functions to monitor fluid injection, formation fracturing, seismic mapping, and the like. The downhole tool 20 may be a wireline tool, a wireline logging tool, a downhole tool string, or other known means of deployment such as a drill collar, a sonde, a drill bit, a measurement-while-drilling tool, a logging-while-drilling tool, a permanent monitoring tool, and the like.

Sensing devices disclosed herein include micro electromechanical systems (MEMS). In some embodiments, a downhole (borehole) tool 20 using high temperature electronics may be used for purposes of sensing, storing, and transmitting data relating to environmental and tool parameters. In this, the devices disclosed may effectively sense and store characteristics relating to components of downhole tool 20 as well as formation parameters at elevated temperatures and pressures.

The cable 22 may be a multiconductor logging cable, wireline, or other means of conveyance and/or communication that are known to persons skilled in the art. The service vehicle 10 includes a surface system 200. The surface system 200 may have appropriate electronic controls and/or processing systems and/or telemetry capability for the downhole tool 20. The cable 22 may typically be electrically and communicatively coupled to the surface system 200.

Figure 2A:
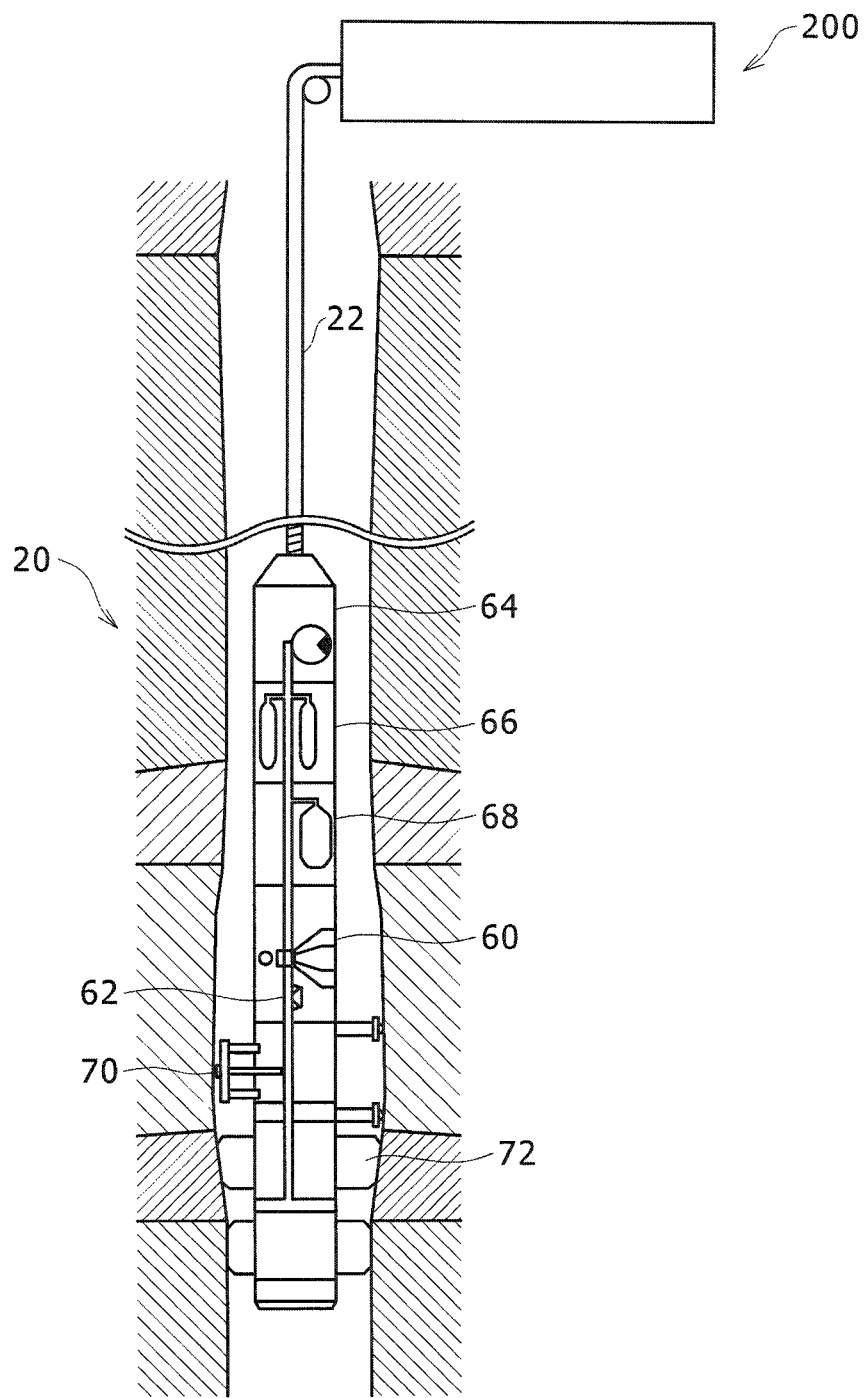
FIG. 2A shows one one configuration for a downhole tool in accordance with an embodiment of the present disclosure.

FIG. 2(A) is an exemplary embodiment of a downhole tool sensing system for downhole analysis and sampling of formation fluids utilizing, for example, a fluid analysis module. The downhole tool 20 may include a variety of electronic components and modules, which are schematically represented in FIG. 2(A). This non-limiting sample of electronic components and modules provides necessary and desirable functionality to the downhole tool 20. Further examples of downhole tools are disclosed in commonly-owned U.S. Pat. Nos. 3,780,575, 3,859,851, and 4,860,581.

As shown, one or more modules may be provided in the downhole tool 20. Fluids may be obtained from a formation and/or borehole flow through a flowline 62, via the fluid analysis module or modules 60 and/or chemical sensor module(s) (not shown), and then may be discharged through a port of a pumpout module 64. Optionally, formation fluids in the flowline 62 may be directed to one or more fluid collecting chambers 66/68 for receiving and retaining the fluids obtained from the formation for transportation to the surface.

The fluid admitting assemblies, such as probe module 70 and/or packer module 72, one or more fluid analysis modules 60 and/or chemical sensor modules, the flow path 62 and the collecting chambers 66/68, and other operational elements of the downhole tool, are controlled by electrical control systems, in some cases by the surface system 200. The surface system 200 may include a control processor operatively connected with the borehole tool. Methods described herein may be embodied in a computer program that runs in the processor. In operation, the program may be configured and communicatively coupled to receive data, for example, from the fluid analysis module 60, via the cable 22, and to transmit control signals to operative elements of the downhole tool 20.

Figure 2B:
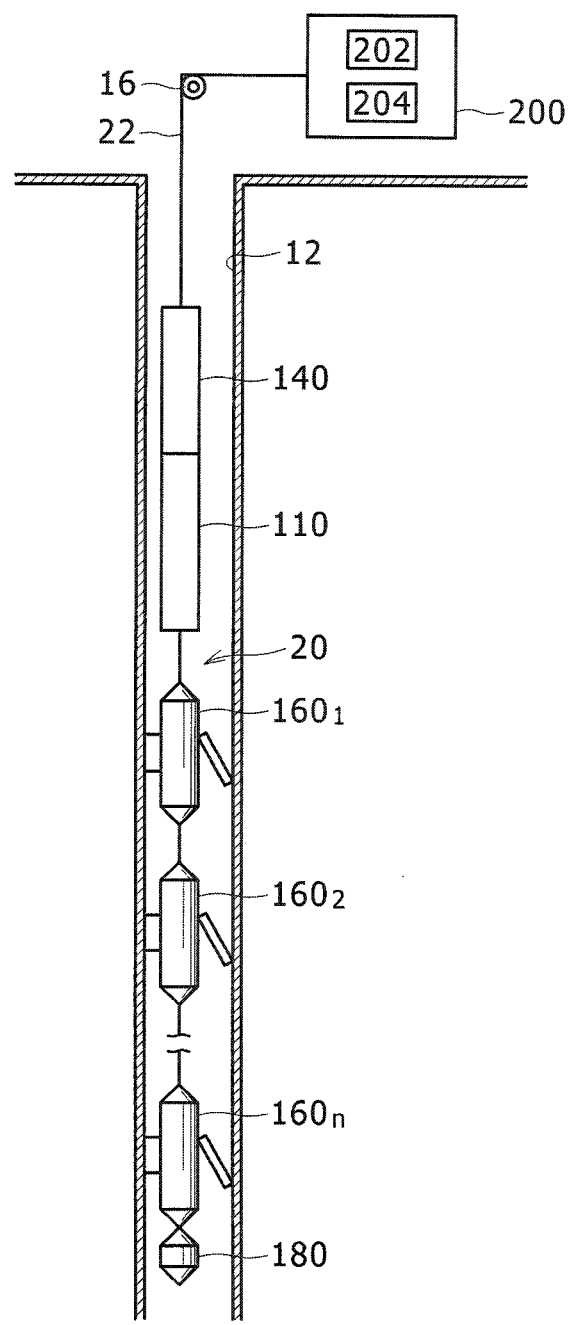
FIG. 2B shows yet another possible configuration for a downhole tool in accordance with an embodiment of the present disclosure.

FIG. 2(B) shows another possible embodiment of a surface control system 200 and downhole tool 20. In this embodiment, the surface system 200 includes a data communication unit 202 and a processing and control unit 204. The data communication unit 202 may include a control processor that outputs a control signal and is operatively connected with the downhole tool 20 via the cable or fiber 22 so that a control signal is delivered to the downhole tool 20. In this example, the downhole tool 20 includes a telemetry cartridge 140, an electronic cartridge 110 having, for example, an electrical tool bus, and an array of tool shuttles $160_1, 160_2, \ldots, 160_n$, and an array terminator 180 provided in this order from uppermost to lowermost in the borehole 12. The telemetry cartridge 140 communicates with the surface system 200. This structure is disclosed in commonly-owned U.S. Pat. No. 6,630,890, the contents of which are incorporated herein by reference in their entirety.

The downhole tool 20 of FIG. 2(B) may include a downhole sensing and data acquisition system placed in the electronic cartridge 110 and the array of tool shuttles $160_1, 160_2, \ldots, 160_n$.

Methods described herein may be embodied in a computer program that runs in the processor 204. The computer program may be stored on a computer usable storage medium associated with the processor, or may be stored on an external computer usable storage medium and electronically coupled to the processor for use as needed. The storage medium may be any one or more of presently known storage media, such as a magnetic disk fitting into a disk drive, or an optically readable CD-ROM, or a readable device of any other kind, including a remote storage device coupled over a switched telecommunication link, or future storage media suitable for the purposes and objectives described herein. In operation, the program may be coupled to operative elements of the downhole tool 20 via the cable 22 in order to receive data and to transmit control signals.

The methods and electronics disclosed herein may be embodied in one or more fluid analysis modules of Schlumberger's formation tester tool, the Modular Formation Dynamics Tester (MDT). The modules may include sensors for detecting local environmental conditions such as pressure, temperature, fluid flow, and vibration. Surface data processing electronics may be coupled to a logging facility (not shown) that may gather, record, process, and analyze information telemetered thereto. The principles described above are applicable not only to MEMS/microfluidics devices but also to macroscale sensor devices or systems.

The sensing systems disclosed herein may be utilized in wireline logging operations in a well using a sonde. Alternatively, coiled tubing may be employed for purposes of deploying the sonde in a wellbore. The sensing systems herein may be utilized for monitoring flow and for other applications relating to production, and production logging tools may be configured according to the sensing systems disclosed herein. Various chemical properties and chemicals may be measured with the aforementioned sensors. In this, the present disclosure also contemplates wireline or slickline tools for the sensing purposes described herein. Additional monitoring applications include fluid injection, formation fracturing, seismic mapping by downhole tools, among others that are known to one of ordinary skill in the art.

Figure 3:
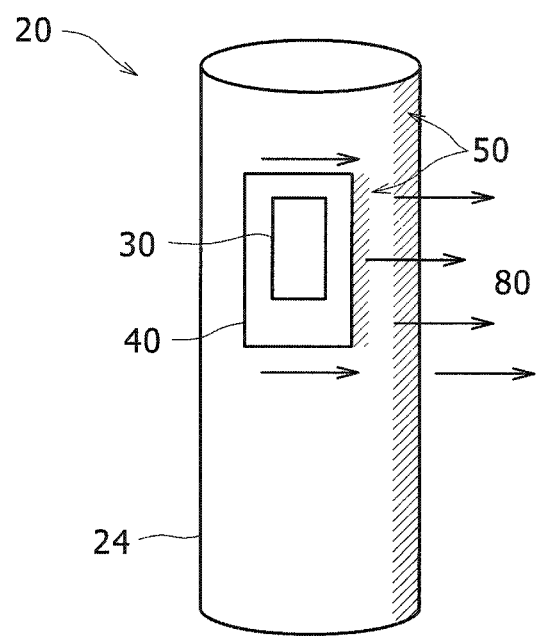
FIG. 3 shows one configuration for a downhole heat dissipation system in accordance with an embodiment the present disclosure.

FIG. 3 is a schematic depiction of one possible configuration for a heat dissipation system according to the present disclosure. Temperature sensitive electronic devices and sensors (collectively known as electronic device 30) are located inside an electronic housing 40 of a downhole tool 20 such as previously described above. The housing 40 of the downhole tool 20 may define an enclosed space for the electronic device 30 within a downhole tool housing 24, free air flow and ventilation is not available, i.e., the downhole sensing system is typically a closed system.

Therefore, in one possible embodiment a micro-particulate heat dissipating coating 50 is applied to the hot side of the electronics housing 40 of the electronic device 30, i.e., the surface of the heat source. Heat is conducted through the coating and radiated therefrom (as shown by the arrows in the figure). It is further contemplated that the micro-particulate heat dissipating coating 50 may be applied to the inner surface of the downhole tool housing 24. In this, heat radiated from the heat source is absorbed by the coating on the inner surface of the downhole tool housing 24 and is conducted to the outer surface of the downhole tool housing 24 so as to be dissipated into the surrounding medium 80.

It is envisioned that various methods may be used to apply the micro-particulate heat dissipating coating 50. In particular, any method suited for the applicable tool design and structure may be used in accordance with the present disclosure. For example, the micro-particulate heat dissipating coating 50 may be applied by spraying, dipping or with a brush. The thickness of the coating may be varied according to the particular application. In this, thin film coatings of about 50 µm may be applied as desirable or necessary. However, the nature of the applied micro-particulate heat dissipating coating 50 should be such that cavities and/or scratches are not prevalent in the coating since irregularities and/or gaps in the coating could impair the efficiency of the heat dissipation.

In experiments it was found that such micro-particulate heat dissipating coating 50 improves the core efficiency of thermal radiation in the infrared wavelength. In this, the operating temperature range of the downhole electronics 30 is improved by use of the micro-particulate heat dissipating coating 50. A test of passive cooling of the housing temperature of two samples was conducted with power resistors mounted on a chassis. In one sample, Cerac α® coating from Ceramission Co., Ltd., was applied to the sample before placing it in a pre-heated oven. The test results showed that use of micro-particulate heat dissipating coating lowered the internal chassis temperature by 12 degrees Celsius.

The applicants concluded that there was a significant effect on the heat transfer between the internal chassis and the external housing in the case of the sample with micro-particulate heat dissipating coating 50. It was surprisingly found that micro-particulate heat dissipating coating 50 improves performance of the heat radiation in high-temperature environments. In this, an improvement of about 12 degrees Celsius would be a useful and effective result for downhole electronics 30 inside an electronics housing 40 further within a downhole tool housing 24.

The applicants concluded that with proper choice of the coating thickness, and the size of the micro-particulate heat dissipating coating 50 area it is possible to optimize the effectiveness and performance of the heat dissipating techniques. For example, in the sample that was coated, micro-particulate heat dissipating coating 50 was applied to the inner wall of the external housing. The applicants believe that this helped the heat transfer from the internal chassis by absorbing infrared radiation. In addition, if micro-particulate heat dissipating coating 50 were to be applied to a heat sink associated with the chassis it could help the radiation of heat. The coating appears to improve the overall transfer of heat in either direction, either in cooling such as with the electronic component, or with heating, such as with the inner wall of the external housing.

FIGS. 4(A) to 4(F) depict schematically some of the other possible configurations for heat dissipating systems according to the present disclosure. In the embodiments of FIGS. 4(A) to 4(F), an active cooler such as a Peltier cooler may be utilized in combination with micro-particulate heat dissipating coating 50. The present applicants have found that in certain instances active cooling by itself is insufficient to obtain the desired results. Since space in a downhole tool is limited there is an inherent limitation on the size of an active cooler. Use of micro-particulate heat dissipating coating 50 would improve the efficiency of an active cooler while reducing the overall size of the active cooler.

Some of the embodiments of FIGS. 4(A) to 4(F) propose temperature sensitive electronic devices and sensors in combination with an active cooler and a heat sink. The heated surface of the device and the active cooler may be coated with micro-particulate heat dissipating coating. Further, inner surfaces of the tool housing may also be coated as desirable or necessary. It is envisioned that a combination of micro-particulate heat dissipating coating 50 and an active cooler would provide a significant reduction in the size of the heat sink that is required for the desired results. For example, by use of micro-particulate heat dissipating coating 50, the size of the heat sink could be reduced by about 20% to about 50%.

Figure 4A:
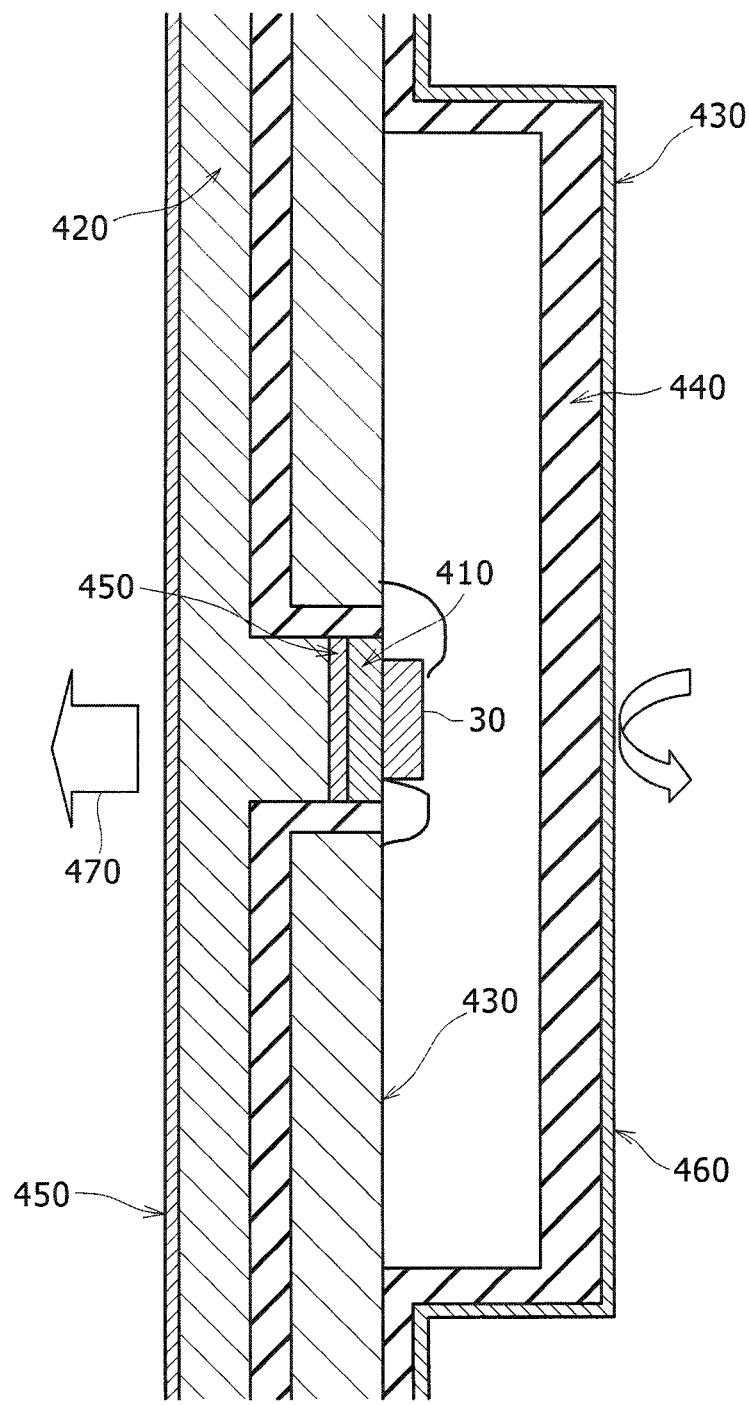
FIGS. 4A-F show other exemplary arrangements for downhole heat dissipation systems in accordance with embodiments of the present disclosure.

Referring generally to FIG. 4A, in this exemplary embodiment, an electronic device 30, such as a chip, is show coupled proximate to a thermoelectric cooling (TEC) device 410. The electronic device 30 may further comprise a printed circuit board (PCB) 430. A thermal interface, such as a micro-particulate coating 450, is placed between the TEC device 410 and a heat sink 420 formed by the electronics housing 40 (see FIG. 3) or the inner wall of the exterior surface of the downhole tool housing 24 (see FIG. 3). The exterior surface may have an additional coating of micro-particulate heat dissipating coating 450 configured to increase the transfer of heat away from the heat generating electronic device 30. The electronic device 30 may be protected by a secondary wall 430 (such as another wall of the electronics housing 40) comprising a thermal insulator 440 and a reflection treatment 460 (seen to the right of the electronic device 30 in the figure). Any heat in the environment to the right of this wall is reflected by the reflection treatment and does not contribute to the heating of the electronic components therein.

As seen by the arrow 470 on the left hand side of the figure, the generated heat from the electronic device 30 flows via the TEC device 410, thermal interface (micro-particulate heat dissipating coating 450), heat sink 420, and high radiation surface treatment (also micro-particulate heat dissipating coating 450) to the environment on the left side of the figure. In some embodiments, this environment may be internal to the tool or it may be the borehole environment (e.g., surrounding medium 80 of FIG. 3) surrounding the downhole tool 20.

As previously discussed, limited space inside the downhole tool housing 24 of a downhole tool 20 and the lack of air circulation pose exceptional problems for the use of temperature sensitive electronics (electronic devices 30) in high-temperature conditions in a borehole 12. Therefore, the capability of improving heat transfer and radiation by use of the techniques disclosed herein provides important improvements to existing cooling systems for downhole applications.

Figure 4B:
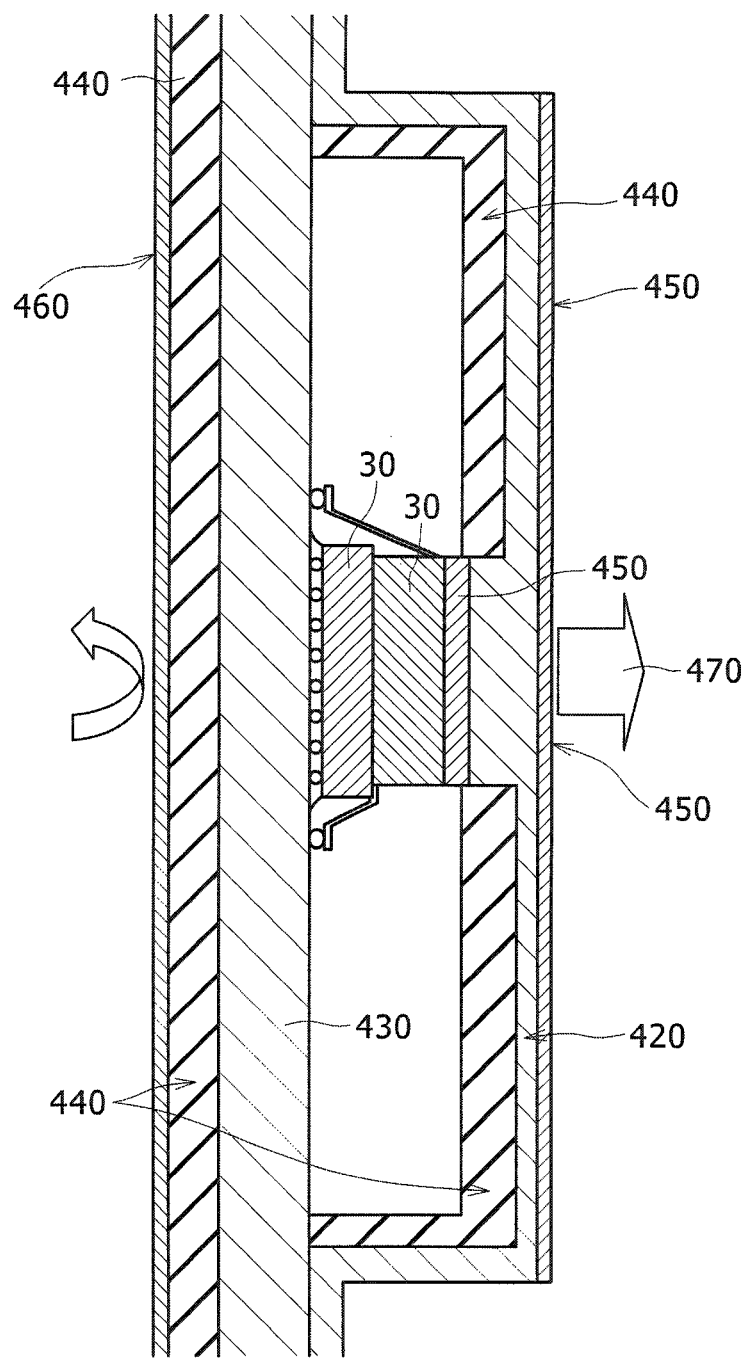

Turning generally to FIG. 4B, another embodiment of the present disclosure is shown in the figure. In this illustrative embodiment, two heat generating electronic devices 30 are stacked. As with the previous embodiment, the electronic devices 30 are coupled to a PCB 430. However, to the left (as shown in the figure) of the PCB 430 is a thermal insulator 440 coated with a reflection treatment 460. Accordingly, any heat generated to the left of the figure would be reflected and not contribute to the temperature of the electronic devices 30.

One surface of the right most (as shown in the figure) electronic device 30 may be coated with a high radiation surface treatment such as a micro-particulate heat dissipating coating 450. In turn, this coating may be in contact with a heat sink 420 further coated with a micro-particulate heat dissipating coating 450. Heat generated by either or both of the electronic devices 30 would then flow to the right as shown by the arrow 470.

Figure 4C:
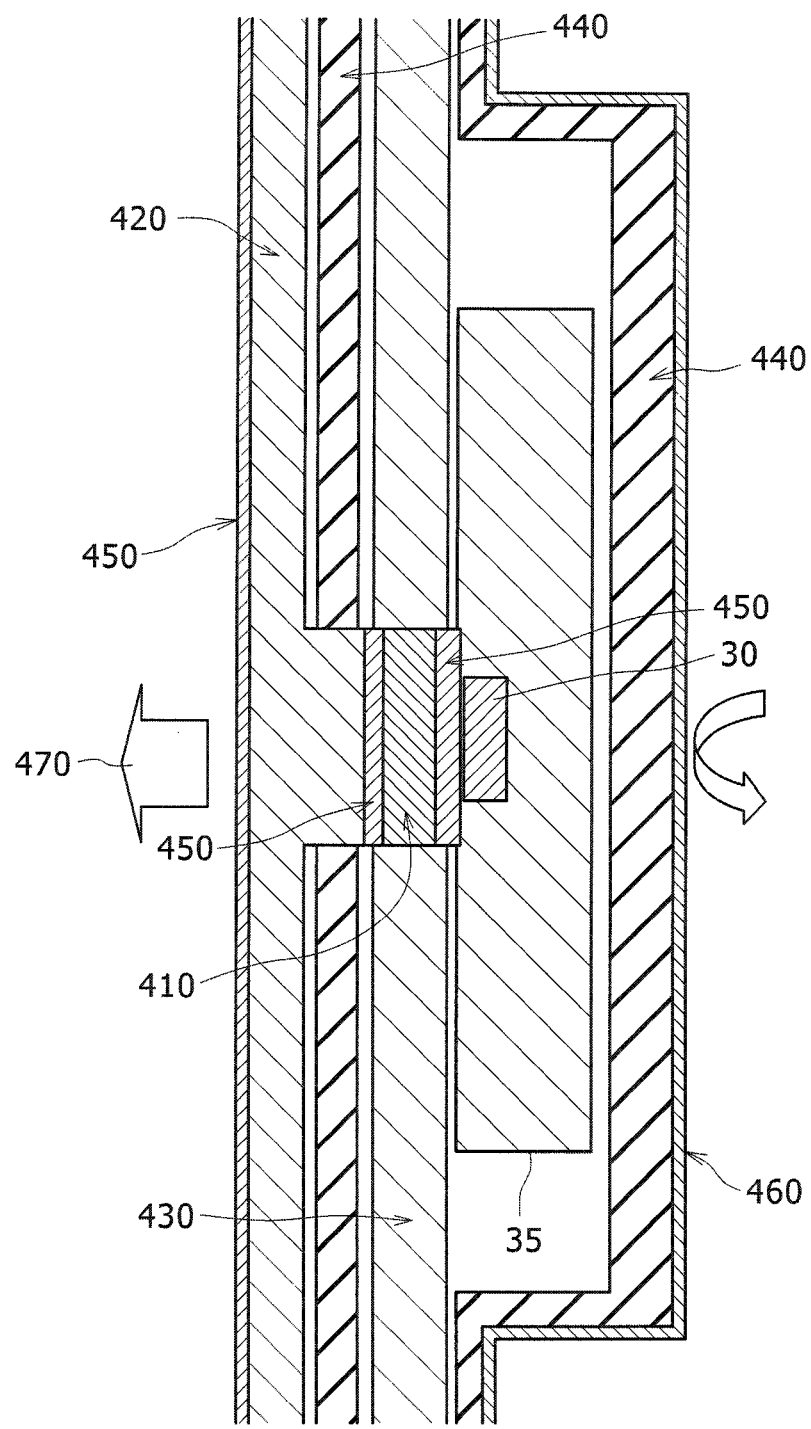

Referring now to FIG. 4C, another embodiment of an application of the present disclosure is shown in this figure. In this embodiment, the electronic device 30 is part of a packaged integrated circuit 35. The electronic device 30 is thermally coupled to a TEC 410 via a thermal interface such as a micro-particulate heat dissipating coating 450. The TEC 410 is in turn coupled to a heat sink 420 via an additional micro-particulate heat dissipating coating 450. The heat sink 420 may comprise yet another micro-particulate heat dissipating coating 450 such that generated heat from the electronic device 30 may flow in the direction of arrow 470. As in some other applications, the generated heat may be conditioned to flow in the direction of arrow 470 through the use of a thermal insulator 440 (on the right hand side of the electronic device 30) and a reflection treatment 460.

Figure 4D:
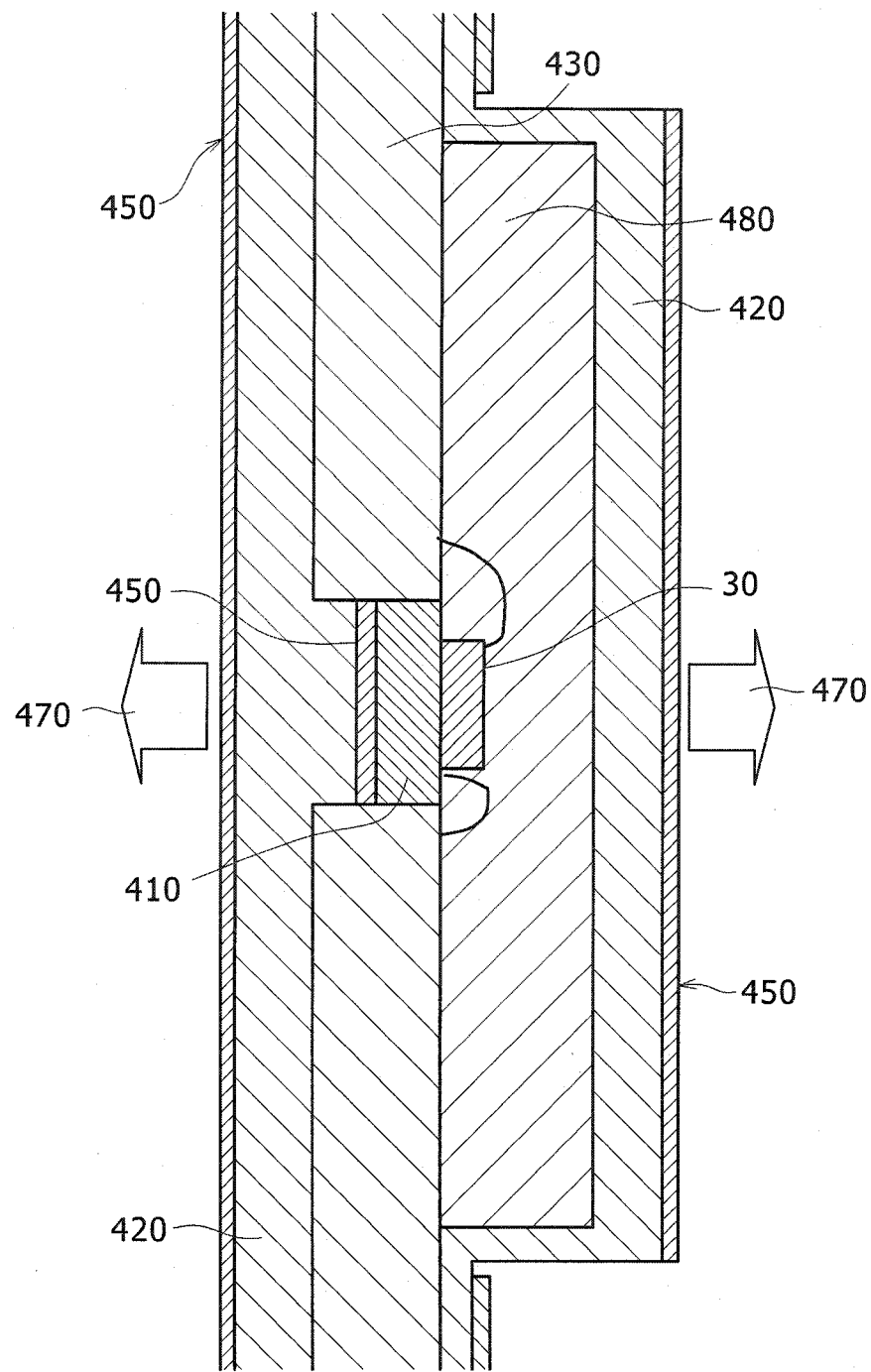

Turning generally to FIG. 4D, another embodiment of an application of the present disclosure is shown in this figure. However, unlike the previous embodiments, the embodiment shown in FIG. 4D has bilateral heat flow as opposed to substantially unidirectional heat flow (as shown by both arrows 470). Instead of having elements of thermal insulators, two heat sinks 420 are provided on either side of the electronic device 30. The electronic device 30 may in turn be coupled on one side to a TEC 410 and on the other side to a thermally conductive medium, such as a thermal interface gel 480. In the embodiment shown, heat generated by the electronic device 30 may flow to the left and the right (as shown in the figure) of the device. Such an application may be provided in cases in which the electronic housing 40 (see FIG. 3) is surrounded by relatively lower temperature environments.

Figure 4E:
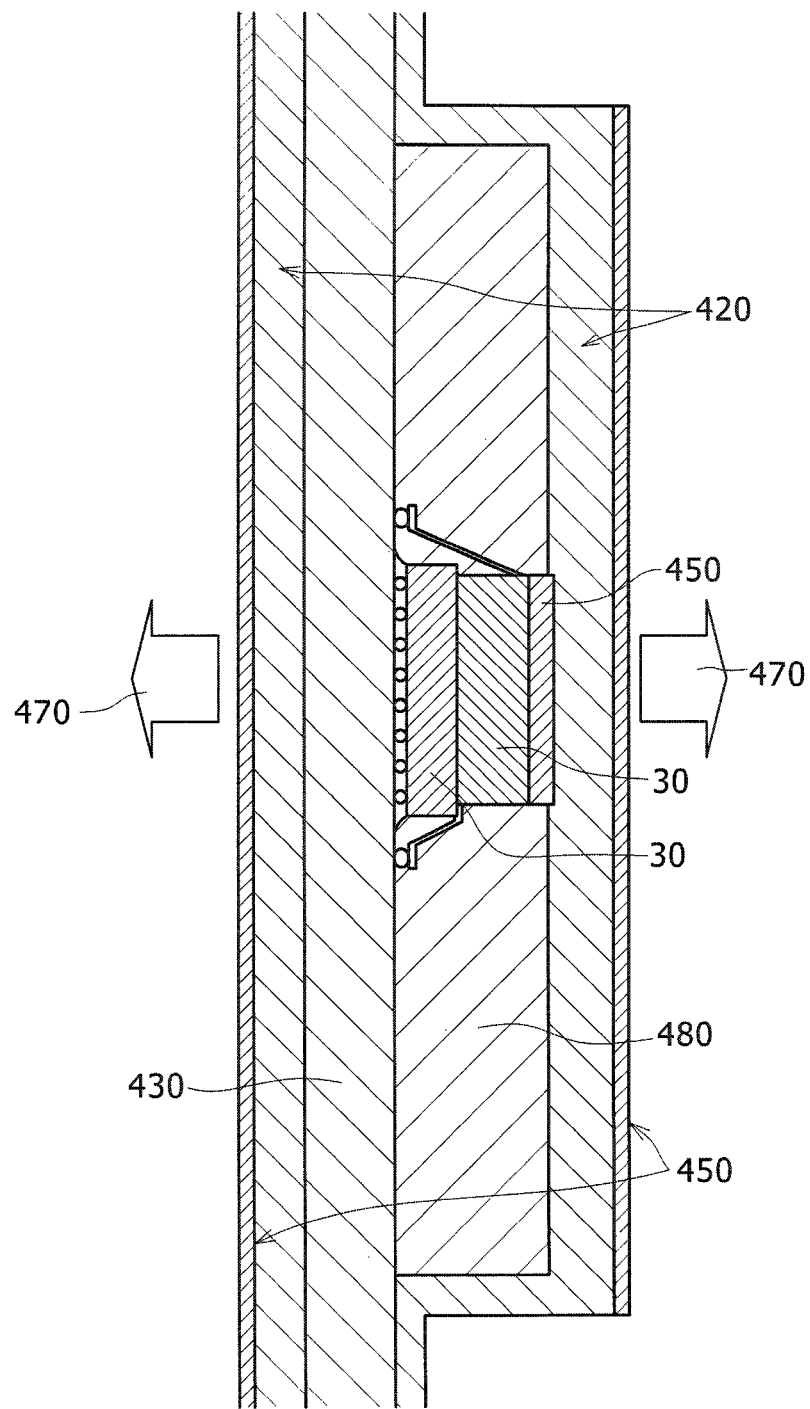

Referring generally to FIG. 4E, another embodiment of an application of the present disclosure is shown in this figure. In this configuration, bilateral heat flow is facilitated via the use of two heat sinks 420 on either side of the stacked electronic devices 30. The outermost surfaces of the heat sinks 420 are provided with micro-particulate heat dissipation coatings 450 to allow the heat to readily flow in the directions of both arrows 470. To further enhance the heat flow, a thermal interface gel 480 surrounds the stacked electronic devices 30 and allow for the conduction of generated heat to one of the heat sinks 420 (to the right of the electronic devices 30 as shown in the figure). In this particular embodiment, generated heat must flow through the PCB 430 to reach the other heat sink 420 (to the left of the electronic devices as shown in the figure).

Figure 4F:
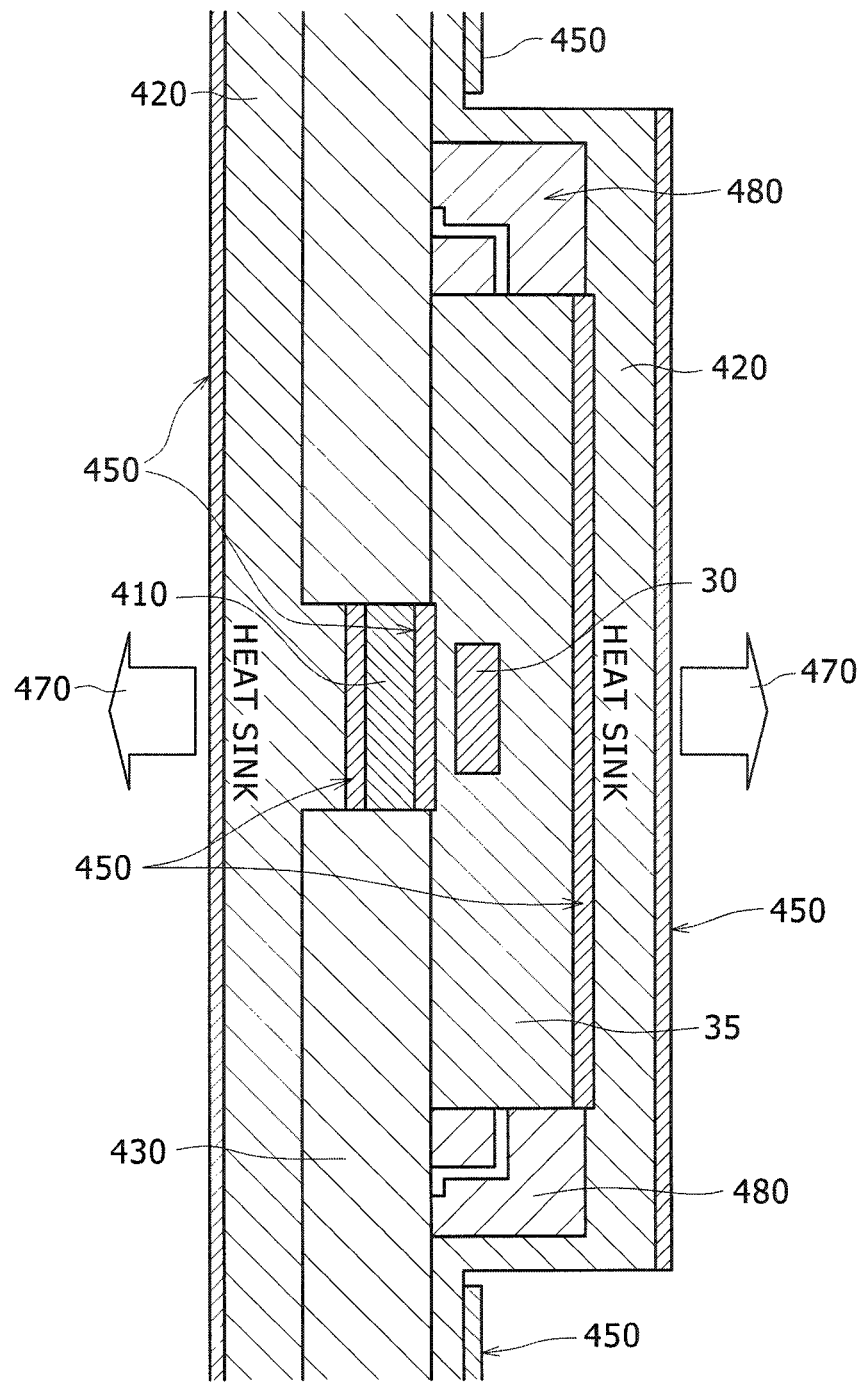

Turning now to FIG. 4F, another embodiment of an application of the present disclosure is shown in this figure. In this configuration, bilateral heat flow is also facilitated via the use of two heat sinks 420 on either side of the electronic device 30 located inside of the packaged integrated circuit 35. As shown, heat generated by the electronic device 30 may flow to the left (as shown in the figure by the left most arrow 470) via a micro-particulate heat dissipating coating 450, to a TEC 410, via another micro-particulate heat dissipating coating 450, to the left most heat sink 420, and to the surrounding environment via another micro-particulate heat dissipating coating 450.

Heat generated by the electronic device 30 may flow to the right (as shown by the right most arrow 470) via the package integrated circuit 35, via a micro-particulate heat dissipating coating 450, to the right most heat sink 420, and to the surrounding environment via another micro-particulate heat dissipating coating 450. Thermal conductivity of the packaged integrated circuit 35 may be enhanced by surrounding the packaged integrated circuit 35 by thermal interface gel 480.

FIG. 5 illustrates one possible method 500 for tool operation in which a downhole tool is deployed in a high temperature environment (Step 510), for example, about 115 degrees Celsius or above temperatures such as around 200 degrees Celsius. The downhole tool may be deployed to acquire data relating to environmental parameters of the surrounding fluids and/or formations as well as density, viscosity, porosity and/or resistivity (Step 520). Furthermore, the downhole tool may be used to acquire data relating to acceleration, pressure, rotation, vibration and/or temperature, or any other downhole tool performance parameter that is desirable or necessary for maintenance or operational history of the downhole tool. Such data are then recorded and/or transmitted to remote receivers for processing and analysis (Step 530).

The preceding description has been presented only to illustrate and describe the invention and some examples of its implementation. It is not intended to be exhaustive or to limit the invention to any precise form disclosed. Many modifications and variations are possible in light of the above teaching.

The embodiments and aspects were chosen and described in order to best explain the principles of the invention and its practical applications. The preceding description is intended to enable others skilled in the art to best utilize the principles described herein in various embodiments and with various modifications as are suited to the particular use contemplated. It is intended that the scope of the invention be defined by the following claims.

What is claimed is:

1. A downhole tool comprising:
   an downhole electronic device contained within a non-ventilated electronics housing; and
   a closed heat dissipation system comprising:
   a micro-particulate heat dissipating coating applied to a surface of a heat sink thermally coupled to one side of the electronic device;
   a thermal insulator positioned proximate to another side of the electronic device;
   a heat sink thermally coupled to the electronic device; and
   wherein an outer surface of the heat sink is coated with the micro-particulate heat dissipating coating.

2. The downhole tool described in claim 1, wherein the heat dissipating system further comprises:
   a thermal electric cooling device thermally coupled to the electronic device.

3. The downhole tool described in claim 2, wherein the thermal electric cooling device is a Peltier cooler.

4. The downhole tool described in claim 1, wherein the heat dissipating system further comprises a thermal interface gel.

5. The downhole tool described in claim 1, wherein the heat dissipating system is configured to facilitate generated heat flow substantially to one side of the electronic device.

6. The downhole tool described in claim 1 further comprising:
   a downhole tool housing;
   wherein an inner surface of the downhole tool housing is coated with a micro-particulate heat dissipating coating located at least partially proximate to the coated outer surface of the electronics housing.

7. The downhole tool described in claim 1 further comprising a reflective coating applied to a surface of the thermal insulator.

8. The downhole tool described in claim 7, wherein the surface of the thermal insulator is an inner surface, and
   wherein an outer surface of the thermal insulator is coated with the reflective coating.

9. The downhole tool described in claim 1, wherein the heat sink is an inner surface of an exterior wall of a downhole tool housing.

10. A downhole tool comprising:
    a downhole electronic device contained within a non-ventilated housing; and
    a heat dissipation system coupled to one side of the electronic device, wherein the heat dissipation system is a closed system and comprises:
    a micro-particulate heat dissipating coating applied to a heat sink thermally coupled to the electronic device;
    a thermal insulator provided proximate to another side of the electronic device; and
    wherein the heat sink forms a surface of the housing.

11. The downhole tool described in claim 10, wherein the heat sink is a part of the tool housing.

12. The downhole tool described in claim 10, further comprising a reflective coating applied to the thermal insulator.

13. The downhole tool described in claim 10, further comprising a thermal electric cooling device thermally coupled to the electronic device.

14. A downhole tool comprising:
    a downhole electronic device contained within a non-ventilated housing; and
    a heat dissipation system coupled to one side of the electronic device, wherein the heat dissipation system is a closed system and comprises:
    a thermal electric cooling device thermally coupled to the electronic device;
    a micro-particulate heat dissipating coating applied to a heat sink thermally coupled to the electronic device;
    a thermal insulator provided proximate to another side of the electronic device.

* * * * *